United States Patent
Zhou

(10) Patent No.: US 9,281,348 B2
(45) Date of Patent: Mar. 8, 2016

(54) DISPLAY PANEL AND FABRICATING METHOD THEREOF

(71) Applicant: BOE TECHNOLOGY GROUP CO., LTD., Beijing (CN)

(72) Inventor: Chunmiao Zhou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/363,229

(22) PCT Filed: Dec. 10, 2013

(86) PCT No.: PCT/CN2013/089002
§ 371 (c)(1),
(2) Date: Jun. 5, 2014

(87) PCT Pub. No.: WO2014/206019
PCT Pub. Date: Dec. 31, 2014

(65) Prior Publication Data
US 2015/0084018 A1    Mar. 26, 2015

(30) Foreign Application Priority Data

Jun. 27, 2013   (CN) .......................... 2013 1 0263834

(51) Int. Cl.
*H01L 29/08* (2006.01)
*H01L 27/32* (2006.01)
(Continued)

(52) U.S. Cl.
CPC ............ *H01L 27/3232* (2013.01); *G02B 27/22* (2013.01); *H01L 27/322* (2013.01);
(Continued)

(58) Field of Classification Search
CPC ....................................... G02B 27/22
USPC .............................. 257/40, E51.026; 349/165
See application file for complete search history.

(56) References Cited

U.S. PATENT DOCUMENTS 5,602,661 A * 2/1997 Schadt et al. ................. 349/124
2004/0085507 A1   5/2004 Miyachi et al.
(Continued)

FOREIGN PATENT DOCUMENTS

CN         1096807 A      12/1994
CN       102695774 A       9/2010
(Continued)

OTHER PUBLICATIONS

Lee et al., Preparation and Characterization of White Phosphorescence Polymer Light Emitting Diodes, 2009, Proc. of SPIE vol. 7415, pp. 1-6.*
(Continued)

*Primary Examiner* — Shaun Campbell
(74) *Attorney, Agent, or Firm* — Ladas & Parry LLP

(57) ABSTRACT

A display panel and a fabricating method thereof are provided, and the display panel (100) comprises: a first substrate (11); a second substrate (12), arranged parallel to the first substrate; an anode/cathode (41), formed on the first substrate; a cathode/anode (42), formed on the second substrate; a first alignment layer (31), provided on the anode/cathode and comprising a plurality of first sub-alignment layers (311) having a first alignment direction and a plurality of second sub-alignment layers (312) having a second alignment direction alternately arranged in a first direction, and a angle between the first alignment direction and the second alignment direction being 90 degrees; a second alignment layer (32), provided on the cathode/anode and comprising a plurality of third sub-alignment layers (323) having the first alignment direction and a plurality of fourth sub-alignment layers (324) having the second alignment direction alternately arranged in the first direction, and the first sub-alignment layers corresponding to the third sub-alignment layers in a position, and the second sub-alignment layers corresponding to the fourth sub-alignment layers in a position; and a light emitting layer (40), provided between the first alignment layer and the second alignment layer, which comprises a liquid crystal polymer doped with organic light emitting material and is configured to emit a polarized light.

13 Claims, 2 Drawing Sheets

(51) Int. Cl.
*G02B 27/22* (2006.01)
*H01L 51/50* (2006.01)
*H01L 51/56* (2006.01)
*H01L 51/52* (2006.01)
*H01L 51/00* (2006.01)
*G02B 5/20* (2006.01)
*G02B 27/26* (2006.01)

(52) U.S. Cl.
CPC ........ H01L27/3211 (2013.01); H01L 51/0076 (2013.01); H01L 51/5012 (2013.01); H01L 51/5293 (2013.01); H01L 51/56 (2013.01); *G02B 5/201* (2013.01); *G02B 27/26* (2013.01); *H01L 51/004* (2013.01); *H01L 51/0039* (2013.01)

(56) References Cited

U.S. PATENT DOCUMENTS

2004/0263060 A1* 12/2004 Gilmour et al. ............... 313/501
2008/0284931 A1* 11/2008 Kimura .......................... 349/39
2011/0015404 A1* 1/2011 Koch .......................... 548/266.2
2013/0037752 A1 2/2013 Koch

FOREIGN PATENT DOCUMENTS

CN 103353673 A 10/2013
CN 203299460 U 11/2013

OTHER PUBLICATIONS

Guha et al., Chain Morphologies in Blue-Emitting POlyfluorenes: Impace on Light-Emitting Diodes, 2006, Mater. Res. Soc. Symp. Proc. vol. 916, pp. 1-11.*
International Search Report Issued Mar. 6, 2014; Appln. No. PCT/CN2013/089002.
First Chinese Office Action dated Dec. 1, 2014; Appln. No. 201310263834.7.
International Preliminary Report on Patentability Appln. No. PCT/CN2013/089002; Dated Dec. 29, 2015.

* cited by examiner

DISPLAY PANEL AND FABRICATING METHOD THEREOF

TECHNICAL FIELD

Embodiments of the present invention relate to a display panel and a fabricating method thereof.

BACKGROUND

The 3D display technology mainly has two broad categories: a glasses type and a naked-eye type. The glasses type 3D technology is mainly divided into a color-difference type, a polarized type and an active shutter type, wherein the image effect of the polarized type 3D technology is better than that of the color-difference type, thus it is widely used in daily life.

The polarized type 3D technology splits light by way of different polarization directions of light, and light for a left eye image and light for a right eye image are made to have different polarization directions through a phase difference plate, then a 3D glasses is used to direct the light for the left eye image and the light for the right eye image having different polarization directions to a left eye and a right eye respectively, and then a stereoscopic image is composed through the human's brain.

With regard to a current polarized type 3D technology using an OLED display panel, a polarizing film is usually needed to be attached to a substrate at a light exiting side of the OLED display panel so as to convert the natural light emitted from the display panel to a polarized light, then a phase difference plate is provided at a light exiting side of the polarizing film, so that light emitted from odd-numbered rows of pixels and even-numbered rows of pixels changes to two polarized lights having different polarization directions after passing through the polarizing film and the phase different plate, which are then received by a left eyeglass and a right eyeglass of a polarization glasses, correspondingly, thus the left eye and the right eye of a viewer receive different polarized lights and then a stereoscopic visual effect is generated.

However, with regard to the current polarized type 3D technology using the OLED display panel, the polarizing film is usually needed to be attached to the OLED display panel and the phase different plate is needed to dispose at the light exiting side, and as there is a certain distance between a light splitting position of the left eye and the right eye and a pixel light emitting position, a crosstalk region and a dead region are formed by light emitted from edges of the display panel, then the 3D viewing cannot be achieved, which narrows 3D upper and lower viewing angles.

In addition, in a current polarized type 3D display device using the OLED display panel, the phase difference plate needs to correspond to the odd-numbered rows of pixels and the even-numbered rows of pixels of the display panel, while it is difficult for the phase difference plate and the display panel to align with each other in a manufacturing process.

SUMMARY

Embodiments of the present invention provide a display panel and a fabricating method thereof, and can overcome issues that upper and lower viewing angles are too narrow and it is difficult to align and attach in a manufacturing process in a current polarized type 3D display panel, and can achieve a polarized type 3D display device with a complete viewing angle and a true and complete stereoscopic image.

On the one hand, the embodiments of the present invention provide a display panel, comprising: a first substrate; a second substrate, arranged parallel to the first substrate; an anode/cathode, formed on the first substrate; a cathode/anode, formed on the second substrate; a first alignment layer, provided on the anode/cathode and comprising a plurality of first sub-alignment layers having a first alignment direction and a plurality of second sub-alignment layers having a second alignment direction alternately arranged in a first direction, and a angle between the first alignment direction and the second alignment direction being 90 degrees; a second alignment layer, provided on the cathode/anode and comprising a plurality of third sub-alignment layers having the first alignment direction and a plurality of fourth sub-alignment layers having the second alignment direction alternately arranged in the first direction, and the first sub-alignment layers corresponding to the third sub-alignment layers in a position, and the second sub-alignment layers corresponding to the fourth sub-alignment layers in a position; and a light emitting layer, provided between the first alignment layer and the second alignment layer, which comprises a liquid crystal polymer doped with organic light emitting material and is configured to emit a polarized light.

On the other hand, the embodiments of the present invention provide a fabricating method of the above display panel, comprising: preparing a first substrate and a second substrate; forming an anode/cathode on the first substrate; forming a cathode/anode on the second substrate; alternately disposing a plurality of first sub-alignment layers having a first alignment direction and a plurality of second sub-alignment layers having a second alignment direction on the anode/cathode in a first direction, wherein the plurality of first sub-alignment layers and the plurality of second sub-alignment layers form a first alignment layer; alternately disposing a plurality of third sub-alignment layers having the first alignment direction and a plurality of fourth sub-alignment layers having the second alignment direction on the cathode/anode in the first direction, wherein the plurality of third sub-alignment layers and the plurality of fourth sub-alignment layers form a second alignment layer; and forming a light emitting layer between the first alignment layer and the second alignment layer, wherein the first sub-alignment layers correspond to the third sub-alignment layers in a position, the second sub-alignment layers correspond to the fourth sub-alignment layers in a position, and the light emitting layer comprises a liquid crystal polymer doped with organic light emitting material and is configured to emit a polarized light.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
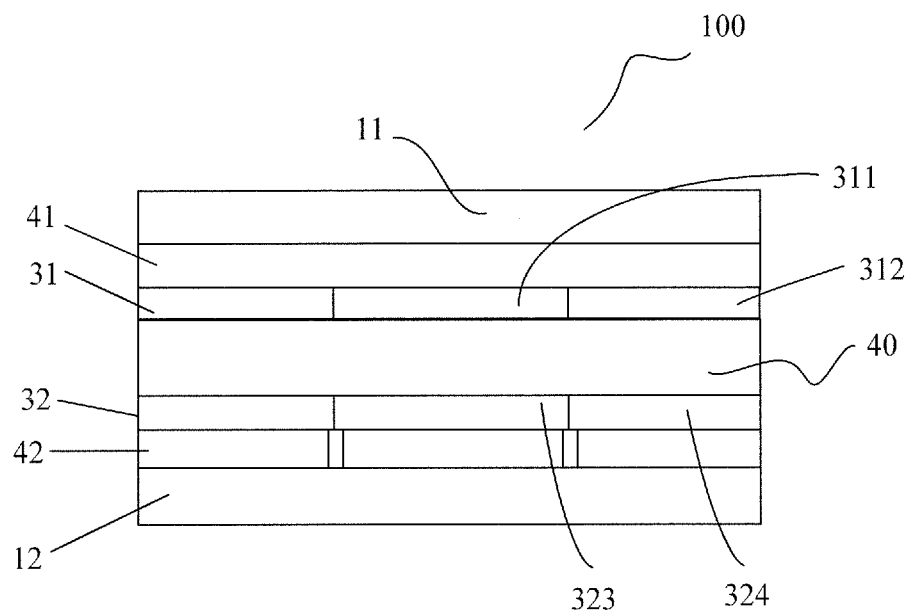
FIG. 1 is a cross-sectional schematic view of a display panel according to an embodiment of the present invention.

Embodiments of the present invention provide a display panel and a fabricating method thereof, which overcome issues that upper and lower viewing angles are too narrow and it is difficult to align and attach in a manufacturing process in a current OLED polarized type 3D display panel, and can achieve a polarized type 3D display device with a complete viewing angle and a true and complete stereoscopic image.

Exemplarily, the display panel according to the embodiments of the present invention comprises: a first substrate; a second substrate, arranged parallel to the first substrate; an anode/cathode, formed on the first substrate; a cathode/anode, formed on the second substrate; a first transfer layer, provided on the anode/cathode; a second transfer layer, provided on the cathode/anode; a first alignment layer, provided on the first transfer layer and comprising a plurality of first sub-alignment layers having a first alignment direction and a plurality of second sub-alignment layers having a second alignment direction alternately disposed along a first direction, and an angle between the first alignment direction and the second alignment direction is 90 degrees; a second alignment layer, provided on the second transfer layer and comprising a plurality of third sub-alignment layers having the first alignment direction and a plurality of fourth sub-alignment layers having the second alignment direction alternately provided in the first direction, and the first sub-alignment layers correspond to the third sub-alignment layers in a position, and the second sub-alignment layers correspond to the fourth sub-alignment layers in a position; and a light emitting layer, provided between the first alignment layer and the second alignment layer, which comprises a liquid crystal polymer doped with organic light emitting material and is configured to emit a polarized light.

Exemplarily, the fabricating method of the display panel according to the embodiments of the present invention comprises: preparing a first substrate and a second substrate; forming an anode/cathode on the first substrate; forming a first transfer layer on the anode/cathode; forming a cathode/anode on the second substrate; forming a second transfer layer on the cathode/anode; alternately disposing a plurality of first sub-alignment layers having a first alignment direction and a plurality of second sub-alignment layers having a second alignment direction on the first transfer layer in a first direction, wherein the plurality of first sub-alignment layers and the plurality of second sub-alignment layers constitute a first alignment layer; alternately disposing a plurality of third sub-alignment layers having the first alignment direction and a plurality of fourth sub-alignment layers having the second alignment direction on the second transfer layer in the first direction, wherein the plurality of third sub-alignment layers and the plurality of fourth sub-alignment layers constitute a second alignment layer; and forming a light emitting layer between the first alignment layer and the second alignment layer, wherein, the first sub-alignment layers correspond to the third sub-alignment layers in a position, the second sub-alignment layers correspond to the fourth sub-alignment layers in a position, and the light emitting layer comprises a liquid crystal polymer doped with organic light emitting material and is configured to emit a polarized light.

Through using the first alignment layer, the second alignment layer and the light emitting layer formed with liquid crystal polarized organic light emitting material, it is unnecessary to additionally attach a polarizing film and a phase difference plate at a light exiting side of a OLED display panel, and thus, technical issues that a current 3D display device cannot achieve the 3D viewing as a crosstalk region and a dead region are formed between the light due to additionally attaching the polarizing film and the phase difference plate to the display panel, and upper and lower viewing angles are too narrow and it is difficult to align and attach in a manufacturing process can be solved, and the viewing angle of the polarized type 3D viewing angle can be ensured.

Exemplarily, as the angle between the first alignment direction and the second alignment direction is 90 degrees, through aligning of the first sub-alignment layers and the third sub-alignment layers, and the second sub-alignment layers and the fourth sub-alignment layers, the light emitting layer emits linear polarized light with different polarization directions, then a left eye image and a right eye image are respectively received by a left eye and a right eye of a viewer through the polarization glasses and are composed by the brain to form a true and complete stereoscopic image, thus the 3D viewing is achieved.

The above technical solutions will be detailed hereinafter in combination with the drawings.

FIG. 1 is a cross-sectional view of a display panel according to an embodiment of the present invention, as shown in FIG. 1, the display panel 100 comprises a first substrate 11, an anode/cathode 41, a first alignment layer 31, a second substrate 12, a cathode/anode 42, a second alignment layer 32 and a light emitting layer 40.

The first substrate 11 and the second substrate 12 are disposed at upper and lower sides respectively and are parallel to each other.

The first alignment layer 31 is formed on the anode/cathode 41. The first alignment layer 31 is formed with alignment material which is capable of transferring carriers, for example, a polyimide alignment layer, and etc. In this embodiment, the polyimide alignment layer is a doping polyimide alignment layer, for example, a polyimide alignment layer doped with star-amine or polyphenylene vinylene (PpV) prepolymer alignment layer.

The first alignment layer 31 comprises a plurality of first sub-alignment layers 311 and a plurality of second sub-alignment layers 312 alternately arranged in a first direction. The plurality of first sub-alignment layers 311 have a first alignment direction and are formed on the anode/cathode 41 according to the first alignment direction. The plurality of second sub-alignment layers 312 have a second alignment direction and are formed on the anode/cathode 41 according to the second alignment direction. Exemplarily, an angle between the first alignment direction and the second alignment direction is 90 degrees, for example, the first alignment direction is inclined at 45 degrees and the second alignment direction is inclined at 135 degrees.

The second alignment layer 32 is coated on the cathode/anode 42. The second alignment layer 32 is formed with alignment material which is capable of transferring carriers, for example, a polyimide alignment layer, and etc. Exemplarily, the polyimide alignment layer may be a doping polyimide alignment layer, for example, a polyimide alignment layer doped with star-amine or polyphenylene vinylene (PpV) prepolymer alignment layer.

The second alignment layer 32 comprises a plurality of third sub-alignment layers 323 and a plurality of fourth sub-alignment layers 324 alternately arranged in the first direction (for example, a x direction). The plurality of third sub-alignment layers 323 have the first alignment direction, correspond to the plurality of first sub-alignment layers 311 in a position and are formed on the cathode/anode 42 according to the first alignment direction. The plurality of fourth sub-alignment layers 324 have the second alignment direction, correspond to the plurality of second sub-alignment layers 312 in a position and are formed on the cathode/anode 42 according to the second alignment direction.

The light emitting layer 40 is located between the first alignment layer 31 and the second alignment layer 32, and an orientation of the light emitting layer is controlled through the first alignment layer 31 and the second alignment layer 32. The light emitting layer 40 comprises a liquid crystal polymer doped with organic light emitting material which can emit a polarized light. Exemplarily, the light emitting layer 40 can comprise a fluorene polymer, for example, PFO-poly(9,9-dioctyl fluorene) or poly(9,9-di(2-ethyl-hexyl)fluorene).

As the light emitting layer 40 has characteristics of electroluminescence, when electrons enter the light emitting layer 40 from the anode/cathode 41 and the cathode/anode 42, the light emitting layer 40 may emit light. Also, as the light emitting layer 40 can be formed with material which can emit a polarized light, the light emitted by the light emitting layer 40 is linear polarized light.

Exemplarily, the display panel according to the embodiments of the present invention comprises a plurality of sub-pixel units, each of the plurality of first sub-alignment layers 311 and each of the plurality of third sub-alignment layers 323 corresponding to it are provided corresponding to a row/column of sub-pixel units, and each of the adjacent second sub-alignment layers 312 and each of the fourth sub-alignment layers 324 corresponding to it are provided corresponding to an adjacent row/column of sub-pixel units, exemplarily, wherein the first direction is a row direction or a column direction of the sub-pixel units.

Figure 2:
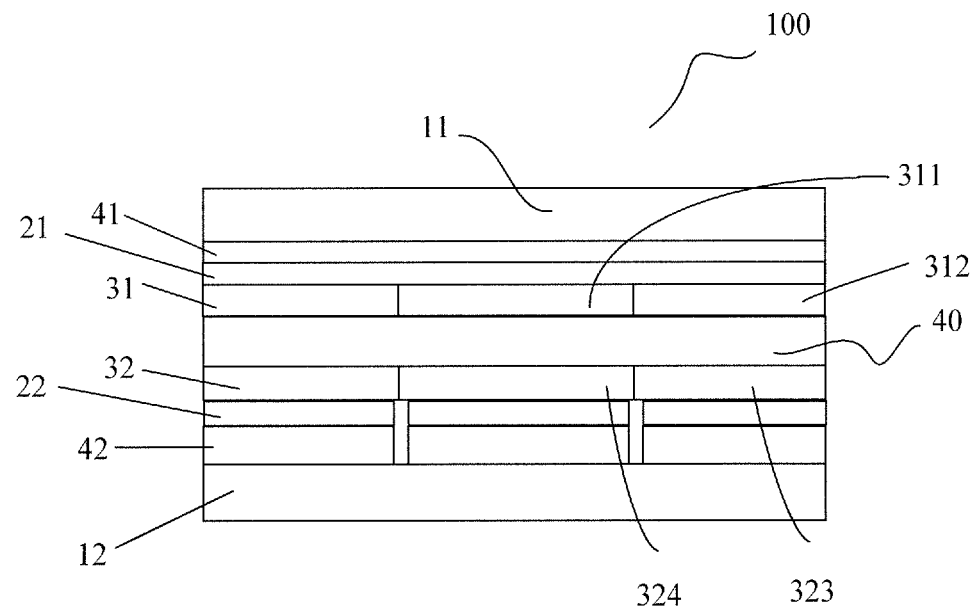
FIG. 2 is a cross-sectional view of another display panel according to an embodiment of the present invention.

Exemplarily, FIG. 2 is a cross-sectional of another display panel according to the embodiments of the present invention, as shown in FIG. 2, based on the display panel shown in FIG. 1, the display panel according to the embodiment of the present invention may further comprise: a first transfer layer 21, provided between the anode/cathode 41 and the first alignment layer 31; and a second transfer layer 22, provided between the cathode/anode 42 and the second alignment layer 32. Herein one of the first transfer layer 21 and the second transfer layer 22 transfers electrons and the other is used to transfer holes. For example, when the first transfer layer 21 is provided near the anode, it is used to transfer holes, and it is used to transfer electrons when it is provided near the cathode, and the second transfer layer 22 is in the same situation, which is omitted herein.

Through using the first alignment layer 31, the second alignment layer 32 and the light emitting layer 40 formed with the liquid crystal polymer doped with organic light emitting material which can emit a polarized light, it is unnecessary to additionally attach the polarizing film and the phase difference plate at an outer side of the display panel 100, and thus, technical issues that a current 3D display device cannot achieve the 3D viewing as a crosstalk region and a dead region are formed between the light due to additionally attaching the polarizing film and the phase difference plate to the display panel, and upper and lower viewing angles are too narrow and it is difficult to align and attach in a manufacturing process can be solved, and the viewing angle of the polarized type 3D viewing angle can be ensured and a true and complete stereoscopic image can be obtained.

The angle between the first alignment direction and the second alignment direction is 90 degrees, for example, when the first alignment direction is inclined at 45 degrees, the second alignment direction is inclined at 135 degrees, through aligning of the plurality of first sub-alignment layers 311 and the plurality of third sub-alignment layers 323, and the plurality of second sub-alignment layers 312 and the plurality of fourth sub-alignment layers 324, also, as the first sub-alignment layer and the second sub-alignment layer respectively correspond to two adjacent rows/columns of sub-pixel units, a polarization direction of light emitted by the light emitting layer 40 for a left eye pixel unit is perpendicular to that of light emitted by the light emitting layer 40 for a right eye pixel unit, through a left eyeglass and a right eyeglass of a polarization glasses with a corresponding polarization direction, the light of the left eye pixel unit and the light of the right eye pixel unit respectively enter a left eye and a right eye of a viewer, and then a true and complete stereoscopic image is composed through the human's brain, thus the 3D viewing is achieved.

Exemplarily, a thickness of the light emitting layer according to the embodiments of the present invention can be determined according to practical situations.

Figure 3:
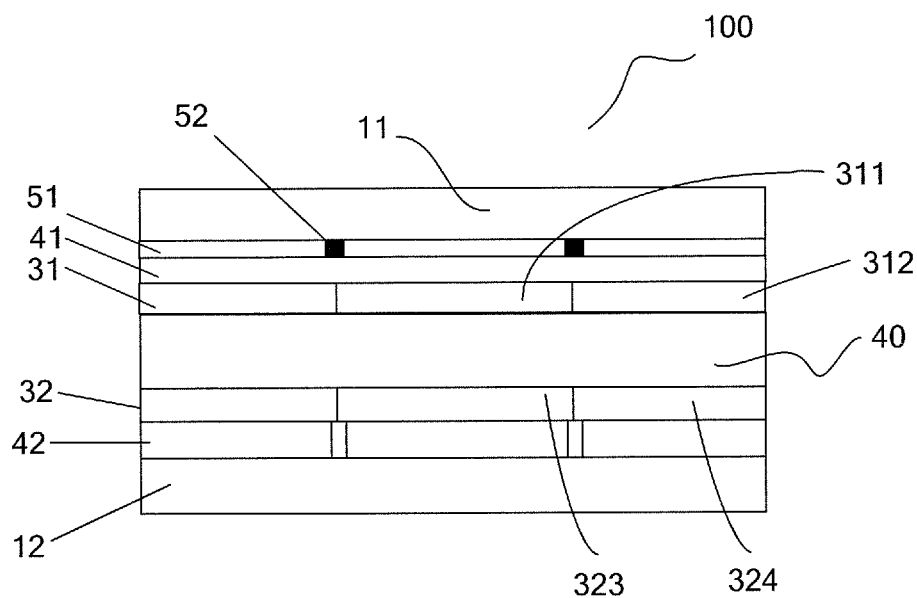
FIG. 3 is a cross-sectional view of still another display panel according to an embodiment of the present invention.

Exemplarily, the display panel according to the embodiments of the present invention may further comprise a plurality of color filters 51, which are provided between the first substrate and the anode/cathode at a display plane side or between the second substrate and the cathode/anode at the display plane side, and each of the plurality of color filters 51 is provided corresponding to each of the sub-pixel units. FIG. 3 is an example, wherein the color filters are provided between the first substrate and the anode/cathode, FIG. 3 is the example in which the color filters 51 are further provided based on the display panel shown in FIG. 1, and exemplarily, the color filters 51 can also be provided based on the display panel shown in FIG. 2, to be simple, the corresponding drawing is not given.

Exemplarily, the plurality of color filters 51 are red color filters, green color filters and blue color filters, each of which respectively corresponds to one sub-pixel unit.

Exemplarily, a black matrix 52 can be provided between the plurality of color filters to block light.

Exemplarily, the plurality of sub-pixel units according to the embodiments of the present invention can comprise a plurality of red sub-pixel units, a plurality of green sub-pixel units and a plurality of blue sub-pixel units, wherein the red sub-pixel units comprise a fluorene polymer emitting a red polarized light, for example, a fluorine/D-A type naphthothiadiazole/benzoselenadiazole copolymer or a fluorene/D-A type naphthothiadiazole/benzoselenadiazole copolymer or a fluorene/thiophene/benzoselenadiazole copolymer, the light emitting layer corresponding to the green sub-pixel units comprises poly(9,9-dioctylfluorene-alt-benzothiadiazole) (PFBT) or vinyl fluorene-vinyl phenothiazine copolymer, and the light emitting layer corresponding to the blue sub-pixel units comprises poly(9,9-dihexylfluorene)(PF2/6) or dioctylfluorene(PFO). At this moment, the color filters need not be provided at the display plane side.

Exemplarily, each of the first sub-alignment layers, each of the second sub-alignment layers, each of the third sub-alignment layers and each of the fourth sub-alignment layers correspond to one column/row of sub-pixel units.

Furthermore, the embodiments of the present invention further provide a fabricating method of the display panel 100, comprising the following steps:

preparing the first substrate 11 and the second substrate 12;

forming the anode/cathode 41 on the first substrate 11;

forming the cathode/anode 42 on the second substrate 12;

alternately disposing the plurality of first sub-alignment layers 311 having a first alignment direction and the plurality of second sub-alignment layers 312 having a second alignment direction on the anode/cathode along a first direction, wherein the plurality of first sub-alignment layers and the plurality of second sub-alignment layers form the first alignment layer 31;

alternately disposing the plurality of third sub-alignment layers 323 having the first alignment direction and the plurality of fourth sub-alignment layers 324 having the second alignment direction on the cathode/anode in the first direction, wherein the plurality of third sub-alignment layers and the plurality of fourth sub-alignment layers form the second alignment layer 32; and forming the light emitting layer 40 between the first alignment layer 31 and the second alignment layer 32, wherein the first sub-alignment layers correspond to the third sub-alignment layers in a position, the second sub-alignment layers correspond to the fourth sub-alignment layers in a position, and the light emitting layer comprises a liquid crystal polymer doped with organic light emitting material and is used for emitting a polarized light.

Exemplarily, the plurality of first sub-alignment layers 311, the plurality of second sub-alignment layers 312, the plurality of third sub-alignment layers 323 and the plurality of fourth sub-alignment layers 324 can be provided in a manner of ink jetting, depositing, coating or sputtering.

Exemplarily, the fabricating method of the display panel 100 according to the embodiments of the present invention may further comprise: forming a first transfer layer between the anode/cathode and the first alignment layer; and forming a second transfer layer between the cathode/anode and the second alignment layer, wherein the first transfer layer is formed on the first substrate in a manner of depositing, coating or sputtering, and the second transfer layer is formed on the second substrate in a manner of depositing, coating or sputtering.

Exemplarily, the fabricating method of the display panel 100 according to the embodiments of the present invention may further comprise: forming a plurality of color filters between the first substrate and the anode/cathode at a display plane side or between the second substrate and the cathode/anode at the display plane side.

Exemplarily, prior to forming the light emitting layer between the first alignment layer and the second alignment layer, the fabricating method of the display panel 100 according to the embodiments of the present invention further comprises: cell-assembling the first substrate formed with the anode/cathode and the first alignment layer with the second substrate formed with the cathode/anode and the second alignment layer. Alternatively, prior to forming the light emitting layer between the first alignment layer and the second alignment layer, the fabricating method further comprises: cell-assembling the first substrate formed with the anode/cathode, the first transfer layer and the first alignment layer with the second substrate formed with the cathode/anode, the second transfer layer and the second alignment layer. Furthermore, the forming the light emitting layer between the first alignment layer and the second alignment layer comprises: injecting the light emitting layer between the first alignment layer and the second alignment layer after the first substrate and the second substrate are cell-assembled; and curing the light emitting layer, for example, light curing or thermal curing.

Exemplarily, the forming the light emitting layer between the first alignment layer and the second alignment layer comprises: forming the light emitting layer on the first alignment layer or the second alignment layer in a manner of depositing, coating or sputtering; cell-assembling the first substrate formed with the anode/cathode and the first alignment layer with the second substrate formed with the cathode/anode and the second alignment layer; alternatively, cell-assembling the first substrate formed with the anode/cathode, the first transfer layer and the first alignment layer with the second substrate formed with the cathode/anode, the second transfer layer and the second alignment layer; and curing the light emitting layer.

The display panel 100 obtained through the above fabricating method of the above display panel can overcome technical issues that a current 3D display device cannot achieve the 3D viewing as a crosstalk region and a dead region are formed between the light due to additionally attaching the polarizing film and the phase difference plate to the display panel, and upper and lower viewing angles are too narrow and it is difficult to align and attach in a manufacturing process, and thus, a polarized type 3D display device with a complete viewing angle can be achieved and a true and complete stereoscopic image can be obtained.

In addition, the light emitted by the light emitting layer 40 for the left eye pixel unit and the light emitted by the light emitting layer 40 for the right eye pixel unit have different polarization directions, through a left eyeglass and a right eyeglass of a polarization glasses with a corresponding polarization direction, the light of the left eye pixel unit and the light of the right eye pixel unit respectively enter a left eye and a right eye of a viewer, and then a true and complete stereoscopic image is composed through the human's brain, thus the 3D viewing is achieved.

Figure 4:
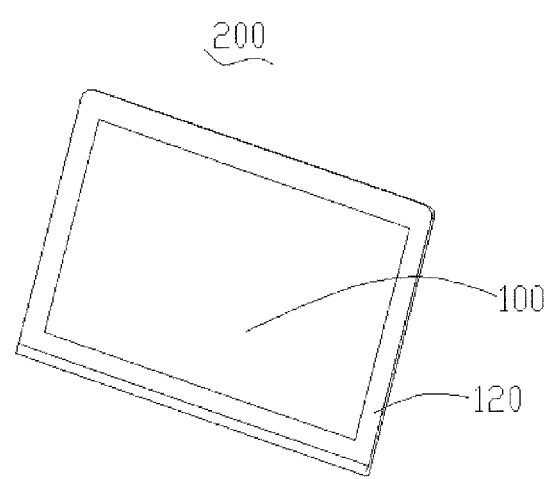
FIG. 4 is a perspective view of a display device comprising the display panel according to an embodiment of the present invention.

Furthermore, the embodiments of the present invention provide a display device comprising the above display panel, as shown in FIG. 4, the display device 20 according to the embodiments of the present invention comprises a housing 120 and the display panel 100 provided within the housing 120.

Exemplarily, the display device 200 is a display or a device that can display image data, such as a television, a computer and a mobile phone.

As the display device 200 uses the above display panel 100, the display device 200 can also overcome the technical problems that upper and lower viewing angles are too narrow and it is difficult to align and attach in a manufacturing process in a current polarized type 3D display device, and thus, a polarized type 3D display device with a complete viewing angle can be achieved and a true and complete stereoscopic image can be obtained.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A display panel, comprising:
   a first substrate;
   a second substrate, arranged parallel to the first substrate;
   an anode/cathode, formed on the first substrate;
   a cathode/anode, formed on the second substrate;
   a first alignment layer, provided on the anode/cathode and comprising a plurality of first sub-alignment layers having a first alignment direction and a plurality of second sub-alignment layers having a second alignment direction alternately arranged in a first direction, and a angle between the first alignment direction and the second alignment direction being 90 degrees;
   a second alignment layer, provided on the cathode/anode and comprising a plurality of third sub-alignment layers having the first alignment direction and a plurality of fourth sub-alignment layers having the second alignment direction alternately arranged in the first direction, and the first sub-alignment layers corresponding to the third sub-alignment layers in a position, and the second sub-alignment layers corresponding to the fourth sub-alignment layers in a position; and a light emitting layer, provided between the first alignment layer and the second alignment layer, which comprises a liquid crystal polymer doped with organic light emitting material and is configured to emit a polarized light wherein a plurality of sub-pixel units comprises a plurality of red sub-pixel units, a plurality of green sub-pixel units and a plurality of blue sub-pixel units, wherein the light emitting layer corresponding to the red sub-pixel units comprises a fluorene/D-A type naphthothiadiazole/benzoselenadiazole copolymer or a fluorene/thiophene/benzoselenadiazole copolymer, the light emitting layer corresponding to the green sub-pixel units comprises poly(9,9-dioctylfluorene-alt-benzothiadiazole)(PFBT) or vinyl fluorene-vinyl phenothiazine copolymer, and the light emitting layer corresponding to the blue sub-pixel units comprises poly(9,9-dihexylfluorene)(PF2/6) or dioctylfluorene(PFO), the first alignment layer and the second alignment layer are a doping polyimide alignment layers, the doping polyimide alignment layer is a polyimide alignment layer doped with star-amine or a polyphenylene vinylene prepolymer alignment layer.

2. The display panel according to claim 1, wherein each of the plurality of first sub-alignment layers and each of the plurality of third sub-alignment layers corresponding to it are provided corresponding to one row/column of sub-pixel units, and each of the adjacent second sub-alignment layers and each of the fourth sub-alignment layers corresponding to it are provided corresponding to one adjacent row/column of sub-pixel units, and the first direction is a row direction or a column direction.

3. The display panel according to claim 1, wherein the first alignment layer and the second alignment layer are formed with alignment material capable of transferring carriers.

4. The display panel according to claim 2, wherein the display panel further comprises a plurality of color filters, which are provided between the first substrate and the anode/cathode at a display plane side or between the second substrate and the cathode/anode at the display plane side, and each of the plurality of color filters is provided corresponding to each of the sub-pixel units.

5. The display panel according to claim 4, wherein, a black matrix is provided between the plurality of color filters.

6. The display panel according to claim 1, wherein the first alignment direction is inclined at 45 degrees or 0 degree, and the second alignment direction is inclined at 135 or 90 degrees.

7. The display panel according to claim 2, further comprising:

a first transfer layer, provided between the anode/cathode and the first alignment layer; and a second transfer layer, provided between the cathode/anode and the second alignment layer.

8. The display pan& according to claim 2, wherein each of the first sub-alignment layers, each of the second sub-alignment layers, each of the third sub-alignment layers and each of the fourth sub-alignment layers have the same thickness.

9. A fabricating method of the display panel according to claim 1, comprising:

preparing the first substrate and the second substrate;
forming the anode/cathode on the first substrate;
forming the cathode/anode on the second substrate;
alternately disposing the plurality of first sub-alignment layers having the first alignment direction and the plurality of second sub-alignment layers having the second alignment direction on the anode/cathode in the first direction, wherein the plurality of first sub-alignment layers and the plurality of second sub-alignment layers form the first alignment layer;

alternately disposing the plurality of third sub-alignment layers having the first alignment direction and the plurality of fourth sub-alignment layers having the second alignment direction on the cathode/anode in the first direction, wherein the plurality of third sub-alignment layers and the plurality of fourth sub-alignment layers form the second alignment layer; and forming the light emitting layer between the first alignment layer and the second alignment layer, wherein the first sub-alignment layers correspond to the third sub-alignment layers in a position, the second sub-alignment layers correspond to the fourth sub-alignment layers in a position, and the light emitting layer comprises a liquid crystal polymer doped with organic light emitting material and is configured to emit a polarized light.

10. The fabricating method of the display panel according to claim 9, wherein before forming the light emitting layer between the first alignment layer and the second alignment layer, the fabricating method further comprises:

cell-assembling the first substrate formed with the anode/cathode and the first alignment layer with the second substrate formed with the cathode/anode and the second alignment layer.

11. The fabricating method of the display panel according to claim 10, wherein the forming the light emitting layer between the first alignment layer and the second alignment layer comprises: injecting the light emitting layer between the first alignment layer and the second alignment layer after the first substrate and the second substrate are cell-assembled; and curing the light emitting layer.

12. The fabricating method of the display panel according to claim 9, wherein the forming the light emitting layer between the first alignment layer and the second alignment layer comprises:

forming the light emitting layer on the first alignment layer or the second alignment layer through depositing, coating or sputtering;

cell-assembling the first substrate formed with the anode/cathode, the first transfer layer and the first alignment layer with the second substrate formed with the cathode/anode, the second transfer layer and the second alignment layer; and curing the light emitting layer.

13. The fabricating method of the display panel according to claim 9, further comprising: forming a plurality of color filters between the first substrate and the anode/cathode at a display plane side or between the second substrate and the cathode/anode at the display plane side: forming a first transfer layer between the anode/cathode and the first alignment layer; and forming a second transfer layer between the cathode/anode and the second alignment layer.

* * * * *